US000001933H

(19) United States

(12) Statutory Invention Registration (10) Reg. No.: US H1933 H

Zabinski et al. (43) Published: Jan. 2, 2001

(54) MAGNETRON SPUTTER-PULSED LASER DEPOSITION SYSTEM AND METHOD

(75) Inventors: Jeffrey S. Zabinski, Dayton; Andrey A. Voevodin, Kettering; Michael S. Donley, Dayton, all of OH (US)

(73) Assignee: The United States of America as represented by the Secretary of the Air Force, Washington, DC (US)

(21) Appl. No.: 08/641,042

(22) Filed: Apr. 8, 1996

(51) Int. Cl.[7] ..... C23C 14/34

(52) U.S. Cl. ..... 204/298.26; 204/298.19; 204/298.23

(58) Field of Search ..... 204/298.01, 298.02, 204/298.07, 298.19, 298.23, 298.26, 298.28; 219/121.6, 121.65, 121.66, 121.85, 121.86; 118/719, 724, 726, 730; 427/586, 588, 589, 590, 596

(56) References Cited

U.S. PATENT DOCUMENTS 4,992,153 * 2/1991 Bergmann et al. ..... 204/298.26
5,242,706 * 9/1993 Cotell et al. ..... 204/298.02
5,395,735 * 3/1995 Nagata et al. ..... 204/298.02
5,468,930 * 11/1995 Nishikawa et al. ..... 427/586

* cited by examiner

*Primary Examiner*—Harold J. Tudor

(74) *Attorney, Agent, or Firm*—Bobby D. Scearce; Thomas L. Kundert

(57) ABSTRACT

System and method for high vacuum sputtering combining magnetron sputtering and pulsed laser plasma deposition are described wherein simultaneous or sequential magnetron sputtering and pulsed laser deposition operations in a single ultra-high vacuum system provides high deposition rates with precise control of film morphology, stoichiometry, microstructure, composition gradient, and uniformity, in the deposition of high performance coatings of various metal, ceramic and diamond-like carbon materials.

16 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

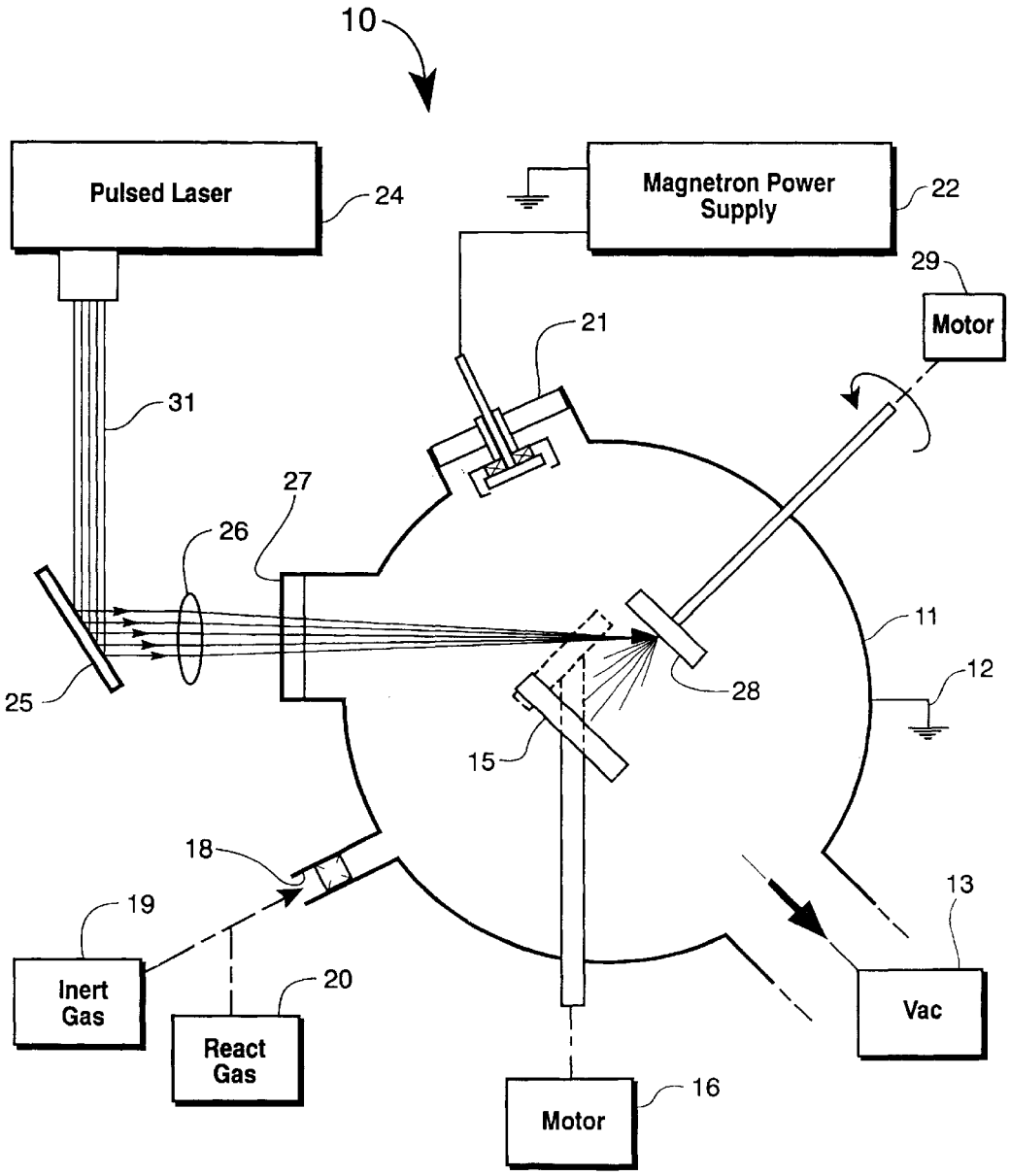
10
Pulsed Laser
24
Magnetron Power Supply
22
29
Motor
21
31
27
26
11
12
25
28
15
18
19
13
Inert Gas
20
React Gas
Vac
16
Motor

MAGNETRON SPUTTER-PULSED LASER DEPOSITION SYSTEM AND METHOD

RIGHTS OF THE GOVERNMENT

The invention described herein may be manufactured and used by or for the Government of the United States for all governmental purposes without the payment of any royalty.

BACKGROUND OF THE INVENTION

The present invention relates generally to systems and methods for high vacuum sputtering, and more particularly to a system and method combining magnetron sputtering with pulsed laser plasma sputtering which provides precise control of film composition, microstructure and uniformity.

In magnetron sputtering, the film is grown by bombardment of a target of film material with ions of inert gas. The bombarding atoms are ionized and accelerated toward the target by intersecting magnetic and electric fields. A chemically reactive gas may be added to grow films of nitrides, carbides or oxides in conjunction with appropriate transition metal targets. This technique provides rapid deposition rates of both metal and ceramic materials with large-area coating uniformity, but the required presence of sputtering or reactive gas limits attainable film composition, microstructure, uniformity, adhesion and purity. Because direct control of the energy of sputtered atoms is not practical, electrical bias applied to the growing film is required for control of film microstructure.

In the pulsed laser deposition technique, a pulsed laser beam is focused onto a target of the film material. Laser-target interactions result in material ablation and an energetic gas plume which condenses on the substrate as a film. This method may be applied in ultra-high vacuum and does not require the presence of a gas to generate the plasma. Direct control of the kinetic energy of ablated species is obtained by varying laser power and focus parameters allowing control of film microstructure, but the method is limited by low deposition rates.

The invention solves or substantially reduces in critical importance problems with prior art sputtering systems and methods as just described by providing system and method for high vacuum sputtering of films combining in a single system both magnetron sputtering and pulsed laser plasma sputtering, which, in combination with suitable substrate position control, allows attainment of high deposition rates with precise control of film morphology, stoichiometry, microstructure, composition gradient, and uniformity not achievable with prior art systems. In the practice of the invention, the magnetron sputtering provides high deposition rates, while plasma laser deposition allows control of film structure, microcrystallinity and stoichiometry. Deposition of a variety of metal, ceramic and diamond-like carbon materials having optimum composition, microstructure, thickness and stress state for any selected application may be accomplished.

The invention is especially useful for the deposition of composite and layered coatings with low friction, low wear rates, and high load support capability and substantially improved wear life for such applications as precision turbine engine components.

It is therefore a principle object of the invention to provide improved system and method for high vacuum sputtering of film materials.

It is another object of the invention to provide an improved high vacuum sputtering system and method combining magnetron sputtering and pulsed laser plasma sputtering.

It is yet another object of the invention to provide improved system and method for vacuum sputtering of films with precise control of film composition, microstructure and uniformity.

It is yet another object of the invention to provide improved system and method for vacuum sputtering of high performance wear resistant coatings.

These and other objects of the invention will become apparent as a detailed description of representative embodiments proceeds.

SUMMARY OF THE INVENTION

In accordance with the foregoing principles and objects of the invention, system and method for high vacuum sputtering combining magnetron sputtering and pulsed laser plasma deposition are described wherein simultaneous or sequential magnetron sputtering and pulsed laser deposition operations in a single ultra-high vacuum system provides high deposition rates with precise control of film morphology, stoichiometry, microstructure, composition gradient, and uniformity, in the deposition of high performance coatings of various metal, ceramic and diamond-like carbon materials.

DESCRIPTION OF THE DRAWINGS

The invention will be more clearly understood from the following detailed description of representative embodiments thereof read in conjunction with the accompanying drawing which is schematic showing the essential components of a system representative of the invention and useful in the practice of the method thereof.

DETAILED DESCRIPTION

Referring now to the accompanying drawing, shown therein is schematic diagram of the essential components of a system 10 representative of the invention and useful in the practice of the method thereof. An ultra-high vacuum chamber 11, grounded as at 12, was operatively connected to vacuum system 13 capable of evacuating chamber 11 to about $10^{-9}$ to $10^{-10}$ torr. Rotatable substrate table 15 was disposed within chamber 11 and driven by suitable motor means 16 operatively connected thereto. Gas inlet 18 defined in a wall of chamber 11 and communicating with source 19 of inert gas and with source 20 of reactive gas provided means for selective insertion of a controlled inert gas atmosphere and/or a reactive gas atmosphere in the operation of system 10 described below. Inert gases suitable for use in the practice of the invention include argon, krypton, xenon, or selected mixtures thereof, and reactive gases suitable for use include oxygen, nitrogen, acetylene, methane, hydrogen sulfide or hydrogen or selected mixtures thereof, or others as would occur to the skilled artisan practicing the invention guided by these teachings. Magnetron sputtering source 21 was disposed in a wall of chamber 11 in suitable position as suggested in the drawing for performing sputtering onto a substrate disposed on table 15. In a unit built and operated in demonstration of the invention, source 21 was a Mini-Mac manufactured by US, Inc. Magnetron power supply 22 (model MDX-1, mfg by Advanced Energy) was operatively connected to source 21. Materials which may generally be sputtered using source 21 include silicon, titanium, chromium, molybdenum, tungsten, niobium, copper, aluminum, hafnium, zirconium, graphite and composite type materials such as $Si_3N_4$, TiC, $B_4C$, BN, TiN, Cr-nitride, Cr-carbide, HfC, HfN, WC, $Al_2O_3$ and AlN, and others as would occur to the skilled artisan practicing the invention. Pulsed laser generator 24 (model 110I, mfg by Lambda Physik in the demonstration system) was disposed externally of chamber 11 as suggested in the drawing, and programmable mirror 25, focusing lens 26, and an entrance window 27 in a wall of chamber 11 provided representative optical means for directing a pulsed laser beam onto rotatable target 28 disposed within chamber 11. The laser beam ablates the target 28 material for deposit as a thin film onto the substrate. Materials comprising target 28 which may generally be sputtered using laser generator 24 include graphite, transition metals (including Ti, Cr, Ni, Mo, W, V, Hf, Zr and Ta, and the carbides, oxides, nitrides and dichalcogens of elements including $MoS_2$, $MoSe_2$, $MoTe_2$, $WS_2$, $WSe_2$, $WTe_2$, $NbS_2$, $NbSe_2$, $NbTe_2$, $TaS_2$, $TaSe_2$, $TaTe_2$, TiC, TiN, TCN, CN, CrC, CrN, WC, HfC, TaC, and $TiB_2$, and polymers of the polycarbonate, polyamide, polyimide, or polytetrafluoroethylene type (such as LEXANTM) and other materials as would occur to the skilled artisan. Externally disposed motor means 29 was operatively connected to target 28 for selectively rotating target 28.

In the deposition of films according to the teachings of the invention, system 10 may be operated in three different modes, namely, sequential deposition wherein magnetron sputtering and pulsed laser deposition are performed in sequence in either order to produce a film deposit, simultaneous deposition wherein magnetron sputtering and pulsed laser deposition operations are performed simultaneously, and a mode comprising laser film processing during film growth.

In the sequential deposition mode of operation, chamber 11 is first evacuated to vacuum of about $10^{-9}$ to $10^{-10}$ torr, an inert gas is introduced as at inlet 18 to a pressure of about $10^{-3}$ torr and power is applied to magnetron source 21 to start sputtering. The sputtered material is deposited as a film (usually about 0.01 to 5 $\mu$m) onto a substrate disposed on table 15. A reactive gas may be added to chamber 11 in order to synthesize a film comprised of a compound such as carbide, nitride and/or oxide. After a desired film thickness is achieved, magnetron source 21 is switched off, the reactive gas feed is closed and chamber 11 again evacuated. Pulsed laser deposition is initiated by energizing laser generator 24 and focusing a laser beam 31 onto target 28 utilizing mirror 25 and lens 26. Ablated material from target 28 is deposited on the substrate (to an additional thickness of about 0.01 to 5 $\mu$m) disposed on table 15. Suitable control of motor 16 allows substrate table 15 to be positioned in confronting relationship to target 28 as shown by solid lines in the drawing or to magnetron sputtering source 21 as shown by dashed lines. Multilayer coatings of various compositions and thicknesses can be deposited utilizing this mode. Since the same material deposited using these two techniques can have considerable differences in mechanical properties, stress relief in the films can be achieved by multilayering of the same compound with alternate layers grown by different sources which allows growth of thicker films (viz., about 0.1 to 10 $\mu$m).

The simultaneous deposition mode is analogous to the sequential deposition mode except that magnetron source 21 and pulsed laser generator 24 are operated simultaneously at chamber 11 pressures corresponding to that required for magnetron sputtering. During such depositions, table 15 may be either continuously rotated or fixed at selected incidence angles with respect to target 28 and magnetron source 21. In this mode, composite films comprising sputtering and laser ablated target materials and reactive gas may be deposited. The heat within the plume generated by laser 31 impingement on target 28 beneficially affects the microstructure, morphology, crystallinity and stress state of the deposited films independently of the magnetron sputtering parameters. In addition, high energy species produced by the laser deposition provide nucleation sites for magnetron produced species. Crystal structure and orientation is determined by the nucleation sites, and the growth rate is determined by the high density magnetron generated plasma.

The laser film processing during film growth mode is analogous to the other modes except that all or part of laser beam 31 is delivered to the surface of the film as it is deposited in order to directly control film microstructure as well as other important physical and crystallographic properties of the deposit. Additionally, laser processing of the magnetron target may be employed to initiate plasma from high refractory materials and promote plasma ionization to a desired level, which maintains constant target texture allowing optimum control over film stoichiometry, while sputtering sintered and/or composite target materials. Any of the aforementioned modes may be used in combination.

The invention therefore provides an improved system and method combining magnetron sputtering with plasma sputtering characterized by substantial control of film composition, structure and uniformity. It is understood that modifications to the invention may be made as might occur to one skilled in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

We claim:

1. A system for simultaneous or sequential high vacuum magnetron sputtering and pulsed laser plasma thin film deposition, comprising:

(a) a vacuum chamber;

(b) a rotatable substrate table disposed within chamber;

(c) a pulsed laser generator external of said chamber;

(d) optical means for directing a laser beam along an optical axis from said laser generator into said chamber;

(e) a rotatable target within said chamber, said target comprising a first material for ablation by said laser beam incident thereon and for deposit of the ablated first material onto a substrate on said rotatable substrate table; and (f) a magnetron sputtering source disposed in a wall of said chamber for sputtering a second material as a thin film deposit onto said substrate; and (g) wherein said rotatable substrate table with said substrate thereon is disposed within said chamber in relation to said magnetron sputtering source and said target to receive said ablated first material and sputtered said second material.

2. The system of claim 1 further comprising means defining a gas inlet in a wall of said chamber and a source of inert gas operatively connected to said inlet for controllably introducing inert gas into said chamber.

3. The system of claim 2 wherein said inert gas is selected from the group consisting of argon, krypton and xenon.

4. The system of claim 1 further comprising means defining a gas inlet in a wall of said chamber, and a source of reactive gas operatively connected to said inlet for controllably introducing a reactive gas into said chamber for reaction with said first material or said second material.

5. The system of claim 4 wherein said reactive gas is selected from the group consisting of oxygen, nitrogen, acetylene, methane, hydrogen sulfide and hydrogen.

6. The system of claim 1 wherein said second material is selected from the group consisting of silicon, titanium, chromium, molybdenum, tungsten, niobium, copper, aluminum, hafnium, zirconium and graphite.

7. The system of claim 1 wherein said second material is a composite type material selected from the group consisting of silicon nitride, titanium carbide, boron carbide, boron nitride, titanium nitride, chromium nitride, chromium carbide, hafnium carbide, hafnium nitride, tungsten carbide, alumina, and aluminum nitride.

8. The system of claim 1 wherein said optical means includes a programmable mirror, focusing lens and an entrance window defined in a wall of said chamber.

9. The system of claim 1 wherein said first material is selected from the group consisting of graphite, the transition metals, carbides, oxides, nitrides and dichalcogens of the transition metals, and polycarbonate, polyamide, polyimide, or polytetrafluoroethylene polymers.

10. A system for thin film deposition, comprising:

(a) a vacuum chamber and a vacuum system operatively connected to said chamber;

(b) means defining a gas inlet in a wall of said chamber;

(c) a source of inert gas operatively connected to said inlet for controllably introducing inert gas into said chamber, (d) a rotatable substrate table disposed within chamber;

(e) a pulsed laser generator external of said chamber;

(f) optical means for directing a laser beam along an optical axis from said laser generator into said chamber;

(g) a rotatable target within said chamber, said target comprising a first material for ablation by said laser beam incident thereon and for deposit of the ablated first material onto a substrate on said rotatable substrate table;

(h) a magnetron sputtering source disposed in a wall of said chamber for sputtering a second material as a thin film deposit onto said substrate; and (i) a source of reactive gas operatively connected to said inlet for controllably introducing a reactive gas into said chamber for reaction with said first material or said second material; and (j) wherein said rotatable substrate table with said substrate thereon is disposed within said chamber in relation to said magnetron sputtering source and said target to simultaneously receive said ablated first material and sputtered said second material.

11. The system of claim 10 wherein said inert gas is selected from the group consisting of argon, krypton and xenon.

12. The system of claim 10 wherein said reactive gas is selected from the group consisting of oxygen, nitrogen, acetylene, methane, hydrogen sulfide and hydrogen.

13. The system of claim 10 wherein said second material is selected from the group consisting of silicon, titanium, chromium, molybdenum, tungsten, niobium, copper, aluminum, hafnium, zirconium and graphite.

14. The system of claim 10 wherein said second material is a composite type material selected from the group consisting of silicon nitride, titanium carbide, boron carbide, boron nitride, titanium nitride, chromium nitride, chromium carbide, hafnium carbide, hafnium nitride, tungsten carbide, alumina, and aluminum nitride.

15. The system of claim 10 wherein said optical means includes a programmable mirror, focusing lens and an entrance window defined in a wall of said chamber.

16. The system of claim 10 wherein said first material is selected from the group consisting of graphite, the transition metals, carbides, oxides, nitrides and dichalcogens of the transition metals, and polycarbonate, polyamide, polyimide, or polytetrafluoroethylene polymers.

* * * * *